US006664176B2

(12) United States Patent
Hedler et al.

(10) Patent No.: US 6,664,176 B2
(45) Date of Patent: Dec. 16, 2003

(54) METHOD OF MAKING PAD-REROUTING FOR INTEGRATED CIRCUIT CHIPS

(75) Inventors: Harry Hedler, Germering (DE); Thorsten Meyer, Erlangen (DE); Stefan Ruckmich, Berlin (DE); Barbara Vasquez, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/944,796

(22) Filed: Aug. 31, 2001

(65) Prior Publication Data

US 2003/0042620 A1 Mar. 6, 2003

(51) Int. Cl.[7] .............................................. H01L 21/44
(52) U.S. Cl. ...................... 438/614; 438/612; 438/613; 438/599
(58) Field of Search ................................ 438/108, 613, 438/612, 614, 597, 119, 598, 599; 257/691, 693, 737

(56) References Cited

U.S. PATENT DOCUMENTS

| 4,866,507 | A | * | 9/1989 | Jacobs et al. | 174/258 |
|---|---|---|---|---|---|
| 6,313,527 | B1 | * | 11/2001 | Han et al. | 257/723 |
| 6,362,087 | B1 | * | 3/2002 | Wang et al. | 438/597 |
| 6,399,421 | B2 | * | 6/2002 | Han et al. | 438/112 |
| 6,458,622 | B1 | * | 10/2002 | Keser et al. | 438/106 |
| 2002/0020855 | A1 | * | 2/2002 | Hwang | 257/200 |
| 2002/0076908 | A1 | * | 6/2002 | Makino et al. | 438/612 |

OTHER PUBLICATIONS

Teutsch et al., 2000, IEEE Electronic Components and Technology Conference, pp. 107–113.*

* cited by examiner

Primary Examiner—Tom Thomas
Assistant Examiner—Douglas W. Owens
(74) Attorney, Agent, or Firm—Fish & Richardson P.C.

(57) ABSTRACT

A method for forming printed re-routing for wafer level packaging, especially chip size packaging. The method includes forming a contact layer on a semiconductor die, printing a conductive redistribution structure on the contact layer, and etching the contact layer of the die by using the conductive redistribution structure as a self-aligning mask.

29 Claims, 9 Drawing Sheets

METHOD OF MAKING PAD-REROUTING FOR INTEGRATED CIRCUIT CHIPS

TECHNICAL FIELD

This invention relates to printed re-routing for wafer level packaging.

BACKGROUND

The process of manufacturing semiconductors, or Integrated Circuits (commonly called ICs, or chips) typically consists of numerous distinct processes during which hundreds of copies of an IC are formed on a single wafer.

The manufacturing process involves forming various patterned layers on and into the substrate, ultimately forming the completed IC. This layering process creates electrically active regions in and on the semiconductor wafer surface.

Following a process known as "die singulation," the individual dies that make up the wafer are assembled into wafer level packages that provide various interconnections for electrical contact between printed circuit boards (PCBs) and the singulated dies or ICs. Various types of high-density packaging technologies exist, such as Flip Chip and Chip Size Packages (CSP).

High-density packaging technologies such as CSP provide many advantages, e.g., reduced sizes, reduced weights, and more reliable electrical connections achievable with wafer level and bare die packaging configurations. However, broad applications of CSP packaging technology have been limited. A major difficulty is the production cost due to the processing complexity of wafer level packaging processes.

SUMMARY

According to one aspect of the invention, a method for forming printed re-routing for wafer level packaging features forming a contact layer and a conductive redistribution structure on a semiconductor die.

The printed re-routing method further includes etching the contact layer of the die by using the conductive redistribution structure as a self-aligning mask.

One or more of the following features may also be included. Forming the contact layer includes realizing semiconductor defining processes on the contact layer of the semiconductor die. The semiconductor structure defining processes include providing contact pads made of a conductive material such as metals and metal alloys. Further, a passivation layer formed of a dielectric material such as a polyimide, is deposited on the die contact layer, serving as a barrier layer.

The structure defining processes further include forming a metal layer on the contact layer of the die by sputtering a conductive material onto the passivation layer. The metal layer provides the required stable electrical contact between the contact pads and the conductive redistribution structure.

As another feature, stencil printing is used for realizing the semiconductor structure defining processes.

As yet another feature, conductive polymers such as Isotropic Conductive Adhesive (ICA) and the glues are used to generate the redistribution lines, which include two ends, the first end including a ring recess and a guide region serving as a bump stop for retaining the interconnect bump and preventing the outflow of the bump material. The interconnect bump material can be solder paste or conductive polymer and may also include an under bump material that is nonconductive. The conductive redistribution structure is also used as a self-aligning mask for etching the metal layer.

According to another aspect of the invention, a semiconductor die includes a contact layer, contact pads attached to the contact layer of the die in a non-peripheral region, a passivation layer, and a metal layer deposited onto the passivation layer.

The semiconductor die further includes a pad re-routing trace on the contact layer of the die. In this aspect, the pad re-routing trace comprises a conductive redistribution structure formed on the metal layer by a printing process and a conductive interconnect bump. The conductive interconnect bump is connected to the conductive redistribution structure as an interconnection between the contact layer of the semiconductor die and a carrier surface. The semiconductor die further includes a metal layer etch on the contact layer caused by using the conductive redistribution structure as a self-aligning mask for etching.

One or more of the following features may also be included.

The contact pads are made from a conductive material selected from a group comprising metals and metal alloys. The passivation layer on the contact layer serves as a barrier layer and is formed of a dielectric material selected from a group comprising a polyimide. The conductive material of the redistribution lines is formed from a group comprising conductive polymers such as ICA and glues.

Another feature of the semiconductor die include the redistribution line. The redistribution line includes a first and a second end, the first end including a bump region having a ring recess and a guide region that serves as a bump stop for surrounding and retaining the interconnect bump to prevent the outflow of the bump material. The interconnect bump material can be solder paste or a conductive polymer.

As another feature, the semiconductor die may further include a nonconductive under bump material deposited onto the contact layer of the die prior to forming a conductive redistribution structure on the contact layer of the die.

Embodiments may have one or more of the following advantages.

The method for forming pad re-routing traces on a semiconductor die significantly decreases the complexity and costs for generating redistribution structures in wafer level packaging. The expensive processes using semiconductor processing equipment for photolithography and plating can be discarded, leading to quite practical and desirable advantages. The expensive processes required in photolithography such as spin resist, curing, exposing, and developing the redistribution structures are replaced by the concise processes of the present invention. The photoresist coating and patterning of an etch mask are no longer required, neither are the use of stripping set tools nor separate mask production. Thus, the number of processes are reduced, leading to greater production efficiency.

Furthermore, using the redistribution structure as a self-aligning mask improves alignment since only one material is used. This optimizes performance relative to field metal etch conditions.

Another benefit is that better compliance in the composite structure is obtained by using ICA to form the interconnect bump as well as the redistribution structures.

Further benefits include the uncoupling between the die contact pad material and the ICA of the redistribution structure, especially in the case of aluminum pads, where there is significant electrical interaction between the redistribution structure and the contact pad leading to unstable conditions. In particular, the use of printed ICA redistribution structure provides a concise and cost-effective method for etching the metal layer, providing a self-adjusting process where no complex photolithography processes are required.

Using the present method, a semiconductor die can be manufactured with fewer process steps. Accordingly, the materials and the yields of each production process of the present invention are improved and the use of manufacture equipment and the complexity involved in implementing the present method and semiconductor die are significantly decreased. Therefore, the goal of achieving a low cost CSP package manufactured by simple processing to produce highly reliable IC packages can be efficiently and productively achieved. Meeting the industry's need for high-density packaging without an unacceptable packaging cost burden at the system level is possible.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
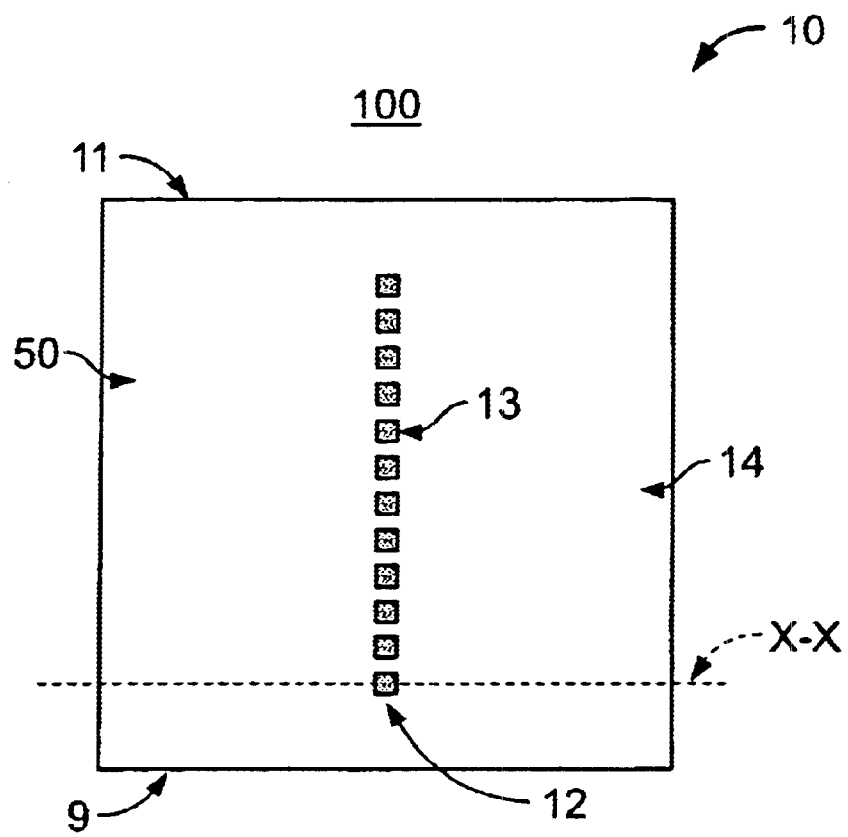
FIG. 1 is a top view of a semiconductor die.

To better understand the invention, it may be helpful to clarify the meaning of certain terms used in connection with semiconductor IC packaging processes and features described hereinafter.

A "semiconductor" is a crystalline material having intermediate values of electrical resistivity (in the approximate range of 10–2 to 109 ohm-cm, between the values for metals and insulators). The resistivity of a semiconductor usually decreases rapidly with increasing temperature. Semiconductors are the basic material of various electronic devices used in telecommunications, computer technology, control systems, and other applications.

A "die" is a single, rectangular piece of silicon wafer or semiconductor material, into which a specific electrical circuit has been fabricated. It is also often referred to as "chip" or "microchip." The plurality of "die" is "dies."

A "pad" is a metal area on a die (typically 100 $\mu$m×100 $\mu$m) designated for attaching the die to the substrate, for die-to-substrate electrical contact, so that an electrical interconnection between the die and the substrate may be formed.

A "package" is the container for a die, often made of plastic or ceramic. A package includes external terminals to provide electrical access to the components inside the package. The external terminals also provide for power, signal distribution, power dissipation, and physical and chemical protection of the circuits.

"Bonding" is a process of securing a die to a package.

"Interconnect" is a highly conductive material, typically aluminum, copper, or polysilicon, that carries electrical signals to different parts of a die. More specifically, "interconnect" may refer to the routing between elements on a die, package or board, required to achieve connection among various circuit elements.

"Routing" refers to the act of connecting all of the interconnections in an IC to the ports of the logic elements, or to the interconnections of the components on a PC board.

"Interconnect bump" is a contact structure covered by a conductive bonding agent used to connect the die to the substrate or board.

"IC" is often used to refer loosely to either two or more interconnected circuit elements on a single die, or to the fabrication technology that combines most of the components of a circuit on a single-crystal silicon wafer, the difference being understood in context.

The process flow for semiconductor manufacturing can be divided into two processes: a "front end" and a "back end" process. The front end process involves wafer processing, i.e., a series of steps, or loops, each of which forms a layer on the semiconductor material. These steps, or loops, include photolithography, etch, strip, diffusion, ion implantation, deposition, and chemical mechanization processes. Collectively, these steps which occur at a "front end" fab or IC foundry are referred to as semiconductor-structure-defining processes. For this reason, they are referred to as "front end" processes.

Following the "front end" processes, the finished wafer is split up into individual dies in a process known as "die singulation." The individual dies are then assembled into (wafer level) packages that are used for electrical connections in the final applications for ICs. This constitutes the "back end" process flow.

One assembly technique, known as flip-chip assembly, requires attaching a bare, unpackaged die face down, directly to a substrate or board. This type of attachment eliminates the need for conventional first level IC packaging and provides the required interconnection between the semiconductor die and a carrier substrate such as that found on printed circuit boards (PCBs).

The following examples illustrate the process for forming printed re-routing traces on a semiconductor die wafer, followed by die interconnect bumping steps used in flip chip and CSP wafer level packing technologies.

Electrical interconnects can be either solder bumps or conductive bumps.

When the interconnects are solder bumps, wafer bumping requires two distinct processes. The first process generates a solderable metal layer for each of the contact pads, as shown in FIGS. 1–6, and I/O pads of a carrier substrate or board (not shown). The second process deposits the interconnect bump material on the contact layer of the die.

A widely used metal in contact pads is aluminum. Since aluminum I/O contact pads are not solderable, a series of metal layers must be deposited to serve as an interface between the I/O pad and the solder bump. This "under bump metallurgy" (UBM) process is engineered to provide, among others, an adhesion layer to the aluminum contact pad, a barrier layer to prohibit the solder from reaching the aluminum, a solderable layer to form the intermetallic connection to the solder alloy, and an oxidation protection layer to ensure robust solderability conditions. Several UBM deposition techniques such as sputtering or electroplating, evaporation, and electroless wet chemistry may be used.

Figure 2:
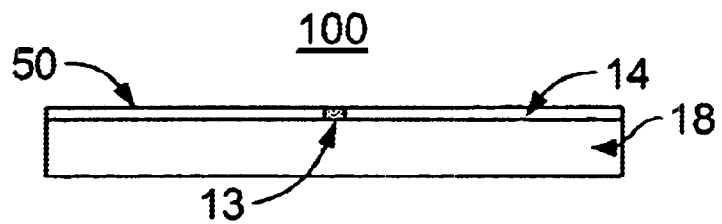
FIG. 2 is a cross-sectional view of the die of FIG. 1, along a line X—X.

FIG. 1 shows a top view of a semiconductor die 10 following die singulation of the wafer. The illustrated die 10 is ready to undergo semiconductor-structure-defining processing and assembly. A passivation process 100 is illustrated in FIGS. 1 and 2.

In this embodiment, a die 10 is a structure having a square footprint and a contact layer 50 on which is disposed a line extending from one die boundary 9 to another die boundary 11 through the interior region of the contact layer 50. An individual pad 13 of the contact pad layout 12 is attached directly to the contact layer 50.

During the passivation process 100, the contact layer 50 of die 10 is covered by a passivation layer 14. During the "front end" process, various oxidation layers may be deposited onto the semiconductor wafers. These layers can be used as masking barriers to create diffused areas in the silicon to electrically isolate electrical paths or transistors from one another. Thus, oxides such as those forming the passivation layer 14 may be deposited onto the contact layer 50 to serve as a final dielectric layer to protect the circuitry below. The passivation layer 14 also protects the contact layer 50 from damage and contamination as it is handled and packaged in the "back end" process flow. The passivation layer 14 is also critical to forming the interconnect for the required electrical connections between the contact layer 50 of the die and the carrier surface (not shown).

The passivation layer 14 is a polyimide. Polymers such as polyimides are preferred in all thin film applications because of their very low dielectric constants and minimum loss tangents. The polymer layer may also act as a stress buffer layer for the subsequent bumping steps. Accordingly, the process of realizing the semiconductor structure defining process on a semiconductor die 10 begins with the passivation process 100.

FIG. 2 illustrates the cross-sectional view of the die 10 as shown in FIG. 1 along a X—X line, showing a silicon layer 18 and the passivation layer 14. The contact pad layout 12 is illustrated in the interior region of the contact layer 50, in the form of an individual contact pad 13.

After the die 10 is covered with the passivation layer 14, a metallization process 102 is performed. In this metallization process 102, a metal layer 20 is subsequently deposited on the die 10. The metallization process 102 is achieved by electroplating Cu (copper) and Ti (Titanium) onto the passivation layer. For example, thin Ti and Cu layers (e.g., 200 nm of Ti and 300 nm of Cu) are sputtered uniformly over the entire semiconductor die 10. Ti also serves as a diffusion barrier for the contact pad 13. The sputtered Cu layer serves as the printing base, thus creating the required metal layer 20. Pd or Ti/Ni/Au metals may also be used.

Figure 3:
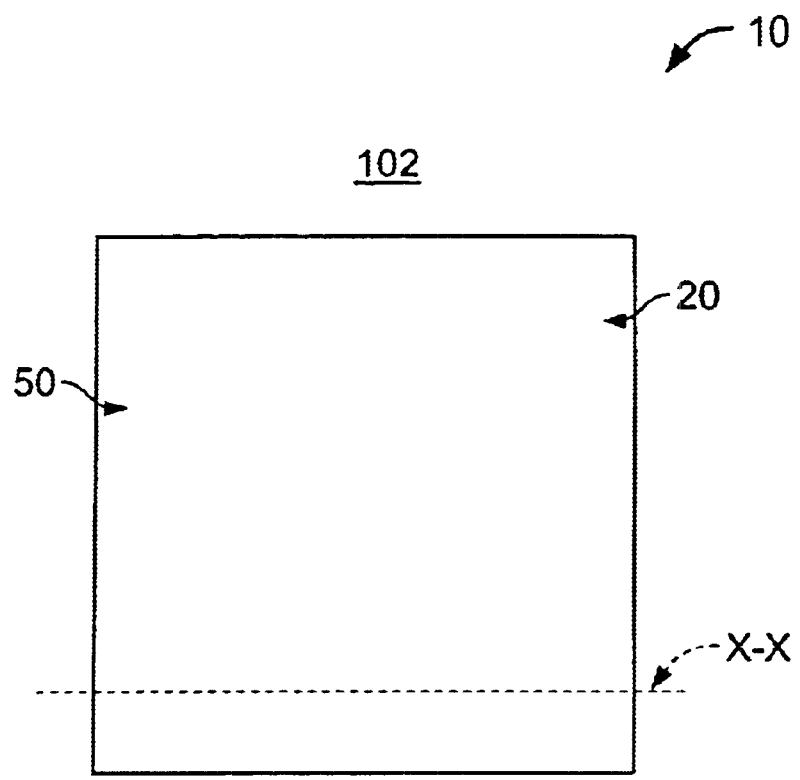
FIG. 3 is a top view of a die after metallization.
Figure 4:
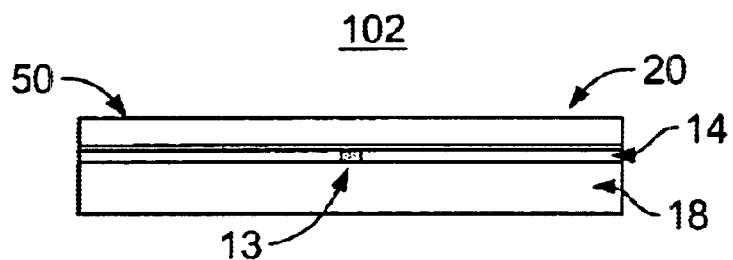
FIG. 4 is a cross-sectional view of the die of FIG. 2, along the line X—X.

FIG. 3 shows a top view of the semiconductor die 10 of FIG. 1 following the metallization process 102. The contact layer 50 is now covered with a metal layer 20, effectively covering the passivation layer 14, thus making the contact pad layer 12 no longer visible from a top view of the contact layer 50. FIG. 4 shows the cross-sectional view of the die 10 shown in FIG. 3, cut along X—X. In FIG. 4, the metal layer 20 completely covers the passivation layer 14 and the contact pad layout 12. Accordingly, the metallization process 102 completes the process of realizing the semiconductor structure defining process.

Figure 5:
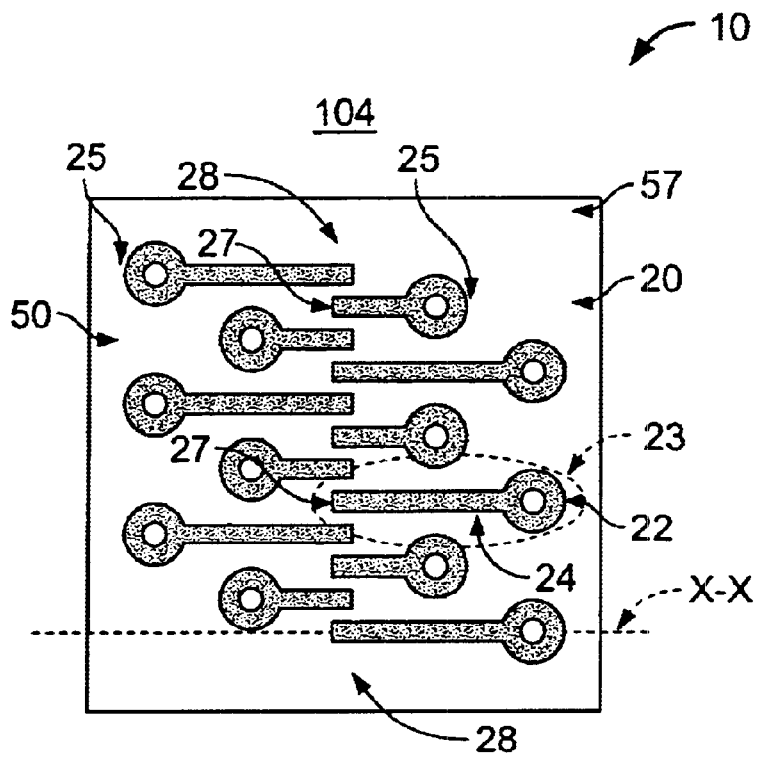
FIG. 5 is a top view of a die with printed redistribution structures.

After the metallization process 102, a re-routing printing process 104, the result of which is shown in FIG. 5. Printing technology is used to form a conductive redistribution structure 23 by generating a bump region 22 coupled to a redistribution line 24. In certain embodiments, selecting the thickness provides greater control of the redistribution structures' conductivity. For example, the conductivity of the redistribution structures 23 can be easily increased by increasing the thickness of the metal layer 20.

In order to form the conductive redistribution structure 23, a method of paste deposition referred to as "stencil printing" is used. Stencil printing is a desirable alternative to Controlled Collapse Chip Connect (C4) processes for printing conductive polymers directly onto the silicon semiconductor wafers. In stencil printing, a stencil, or any other type of mask is used to apply a conductive material onto the contact layer 50.

Stencils typically have apertures positioned in a predetermined pattern corresponding to the pattern of the desired redistribution design or contact pads on the contact layer of the die.

In this embodiment, a stencil may be positioned over the contact layer 50 where the conductive material is to be applied. The stencil apertures in the stencil are then aligned over the contact layer 50 to substantially cover it. A conductive polymer, or glue is urged mechanically by, for example, a squeegee, across the upper surface of the stencil and through its apertures. The conductive material is thereby accurately deposited onto the appropriate regions of the contact layer 50, resulting in the redistribution pattern or design as shown in FIG. 5.

It is important that the conductive material be deposited uniformly and that it be confined to the appropriate region. Various well-known stencil printing techniques can be used to prevent irregularities in the distribution of the conductive material caused by the separation of the stencil mask from the die surface on which the stencil rests during application of the material.

Each redistribution line 24 includes a first end 25 and a second end 27. In FIG. 5, the redistribution lines 24 are parallel to each other, with the second end 27 of each redistribution line 24 coinciding or overlapping with the second ends of other redistribution lines in a contact region 31 (shown in FIG. 7). In other words, each second end 27 is positioned along a die alignment axis 28, thereby allowing electrical interconnection between the different redistribution structures 23 and the contact pad 13 of the contact pad layout 12 deposited below the metal layer 20. As further illustrated in FIG. 5, the first end 25 of the redistribution line 24 forms a bump region 22 having a ring recess 26 (shown in FIG. 6).

Figure 6:
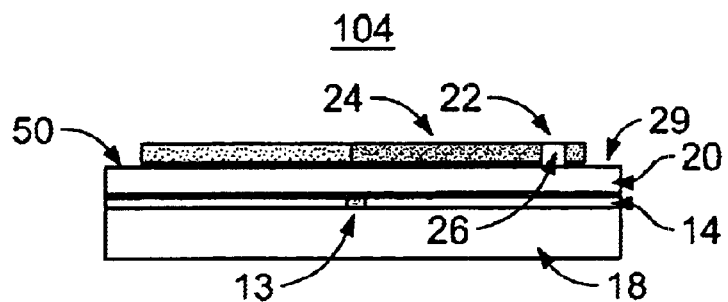
FIG. 6 is a cross-sectional view of the die of FIG. 5, along the X—X line.

FIG. 6 shows the printed re-routing trace 57 of the present invention in cross section along X—X, following the re-routing printing process 104. The redistribution line 24 of a redistribution structure 23 is shown placed sequentially above the metal layer 20, exposing an uncovered die area 29. The re-routing printing process 104 also forms a ring recess 26 in the bump region 22 of the redistribution structure 23. The contact pad 13 is shown positioned in an interior region of the passivation layer 14 deposited sequentially below the metal layer 20 and the redistribution line 24.

FIG. 6 further shows the electrical interconnect between the contact pad 13 and the redistribution line 24. This electrical interconnect is carried from the contact pad 13 along and through the metal layer 20 to the overlapping contact region 31 (FIG. 7) and to the second end 27 of the redistribution line 24. Thus, a wafer level printed re-routing trace 57 across the various layers of the semiconductor die 10 is achieved on the contact layer 50.

Generating a printed re-routing trace 57, as shown in FIG. 5, is typically done to convert an extrinsic area-array IC originally designed for periphery bonding to one that can be area-array bonded by means of redistribution re-routing traces. Furthermore, a redistribution process flow such as that implemented in the present invention allows peripheral pad pitches to be reconfigured into area arrays having significantly larger pad pitches, allowing interconnections on less costly, and less complex PCBs. To this end, wafer bumping technology is preferably employed. Wafer bumping offers the advantage of superior electrical performance and a smaller footprint as compared to wire-bond ICs.

Accordingly, after the re-routing printing process 104, a bumping step 106 is performed. This is the second phase of the front end process. This second phase involves depositing an interconnect bump 30 (FIG. 7) onto the contact layer 50 of the die 10. The interconnect bump 30 is deposited in the bump region 22 connected to the redistribution line 24 to provide an external connection between the contact layer 50 of the die 10 and the carrier surface.

Known interconnect elements are made from solder. Solder bumps may be either plated or deposited using a print technology. In this embodiment, the re-routing printing process 104 is used in connection with the stencil deposition of the solder. A flip chip solder bump provides both the mechanical and electrical connection between the die and the substrate. To faciliate processing and to enhance reliability, it is essential that sufficient solder be uniformly deposited on each bump region 22. Although other metals, such as gold, can be used, typically solder paste, which is a water soluble solder alloy powder in a viscous binder, is used for deposition.

Bricks of solder paste are deposited onto the redistribution structures 23. Subsequently, the solder paste is reflowed using a conventional heat transfer mechanism (such as convection, RF, or condensation) to form a solder bump.

In an alternate embodiment of the present invention, a compliant bump provides better performance in temperature cycling. A suitable compliant bump material is a conductive polymer or glue such as ICA. The conductive polymer can be printed using stencil printing technology.

Figure 7:
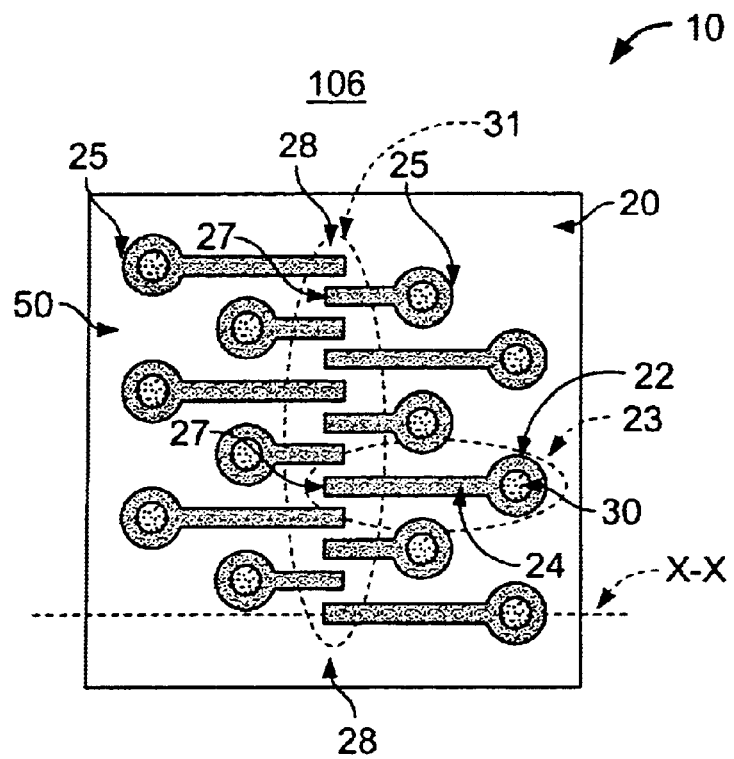
FIG. 7 is a top view of the die of FIG. 5 with an interconnect bump material.
Figure 8:
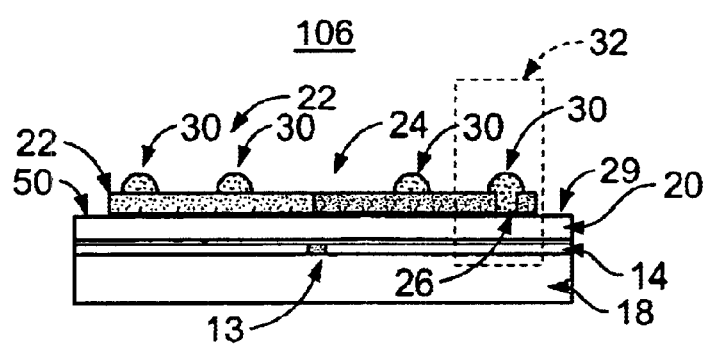
FIG. 8 is a cross-sectional of the die of FIG. 6, along the X—X line.

FIGS. 7 and 8 show the die after completion of a bumping step 106. A conductive material or solder is deposited onto the bump region 22 of the redistribution structure 23, interconnecting the die 10 with the carrier surface of a board.

FIG. 7 shows a top view of the die 10 with the redistribution structure 23 having solder or conductive bumps printed thereon. An interconnect bump 30 is shown deposited within the recess 26 of the bump region 22.

FIG. 8 shows the die of FIG. 7 in cross section along the line X—X. Specifically, a cross-sectional view of the die 10 following the bumping step 106 is shown. The interconnect bump 30 is illustrated sequentially deposited on the first end 25 of the redistribution line 24. Specifically, a bump area 32 illustrates the interconnect bump 30 deposited within a ring recess 26 of the bump region 22. The interconnect bump 30 is physically coupled to the redistribution line 24 through the bump region 22. The second end 27 of the redistribution line 24 overlaps with the second ends of different redistribution lines along the die alignment axis 28 in the contact region 31. In other words, the various redistribution structures are electrically interconnected to each other at the contact region 31. Consequently, the contact pad 13 is electrically connected to all the redistribution structures through the metal layer 20, the redistribution line 24, the bump region 22, and the interconnect bump 30.

For the bumping step 106, stencil printing technology is used for solder or conductive material deposition onto the bump region 22. Like the printing process used for generating the redistribution structures 23, stencil printing includes manufacturing a stencil containing apertures disposed to align with the contact pad layout 12 across the contact layer 50 of the die 10. Bump material, either solder or conductive material, is transferred through the stencil to the wafer by pushing a bead of solder or conductive paste across the stencil with a squeegee blade, for example.

Figure 13:
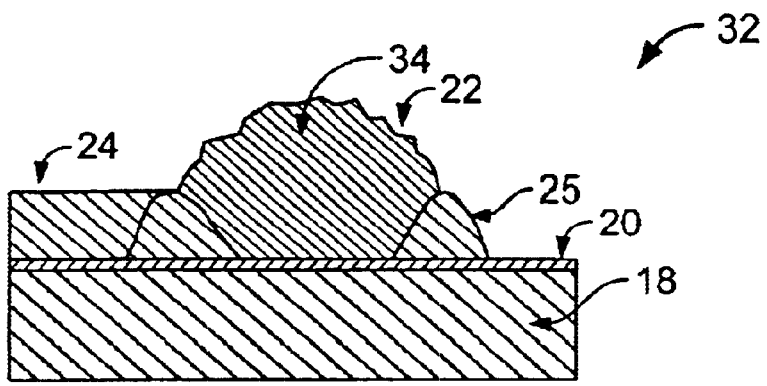
FIG. 13 is a cross-sectional view of an interconnect bump area.
Figure 14:
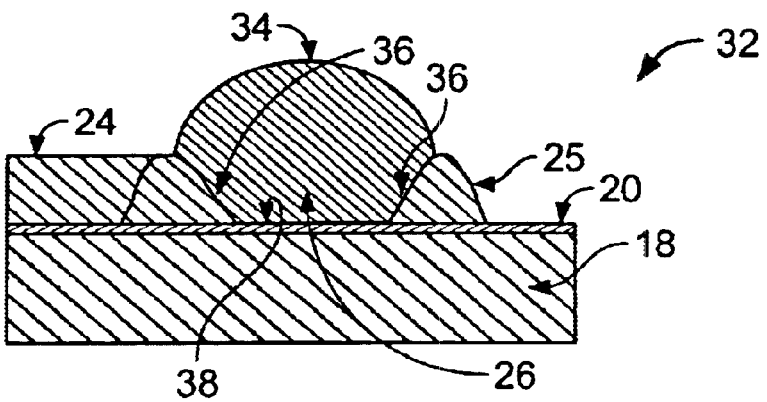
FIG. 14 is another cross-sectional view of the solder bump area of FIG. 13 after solder reflow.
Figure 15:
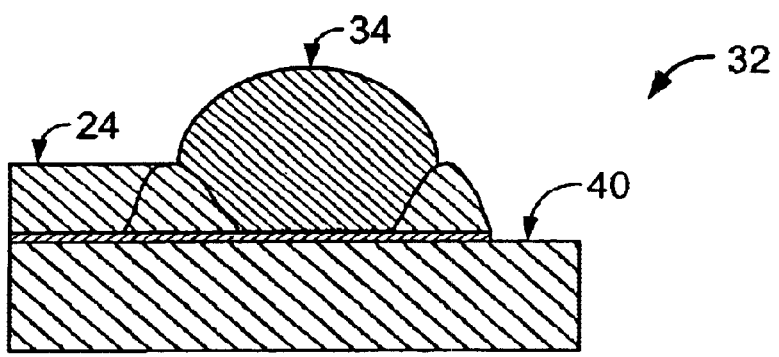
FIG. 15 shows another cross-sectional view of the solder bump area of FIG. 14 after metal etching.

FIGS. 13–15 illustrate the bump area at different stages of the bumping step 106 and the subsequent etching of the metal layer 20. In particular, FIGS. 13–15 show the bump area 32 of FIG. 8 during solder paste deposition. In FIG. 13, printed solder paste 34 is deposited within the ring recess 26 of the bump region 22. The redistribution line 24 is shown bonded to the bump region 22.

Solder paste 34 is formed from a mixture of solder particles and flux. Conventional solder pastes used for forming either high temperature solder (97% Pb, 3% Sn) or low temperature, eutectic solder (37% Pb, 63% Sn) may be used. The solder paste 34 dispensed in the openings and recesses of the stencils will form the solder bumps on the carrier substrate being bumped. Therefore, the choice between a high temperature or low temperature solder will depend upon the desired final bump composition. In general, high temperature solder is used in applications in which the flip chip is attached to ceramic or other high temperature surface carriers, while low temperature solder is usually used in applications in which the flip chip is attached to organic or other low temperature surface carriers.

Returning to FIG. 13, printed solder paste 34 is deposited within the ring recess 26 and the solder reflow step is responsible for the smooth spherical solder bump as seen in FIG. 14. The reflow of the solder paste determines the uniformity of the solder ball. This, in turn, determines the way in which a given contact layer of a die will ultimately mate with its board connection or carrier surface. Factors that affect proper ball size and shape include heating mechanism, heating rates and temperature. Moreover, to produce these well-formed and reliable solder bumps, the reflow process must be carefully optimized to provide the most suitable features.

To this end, in FIG. 14, the first end 25 of the redistribution line 24 includes a ring recess 26 and a guide region 36. As the reflow process is undertaken, the guide region 36 serves as a bump stop for surrounding and retaining the solder paste 34 within the ring recess 26, thus preventing the outflow of the solder paste 34 and producing a smooth and reliable solder joint.

As shown in FIG. 14, a solder underbump metallization (UBM) 38 ensures a low and stable contact resistance at the interface between the plurality of interconnect bumps 30 and the plurality of contact pads 13. The aluminum contact pads 13 may be re-metallized to eliminate non-conductive aluminum oxide.

Additionally, the UBM may fulfill the following additional requirements: (1) adhere to the metal layer 20 and passivation layer 14 of the die; (2) hermetically seal the passivation layer 14 to protect the silicon layer 18 (FIG. 1) from the environment; (3) act as a diffusion barrier between the plurality of interconnect bumps 30 and the metal layer 20; (4) offer a wettable surface for optimum solder reflow (as solder is attracted to wettable surfaces); and (5) induce the least amount of stress so that long-term reliability is not affected. Standard processes for UBM include a native oxide etch prior to sputtering thin layers of metals onto the entire contact layer of the die 10.

Following the solder reflow in FIG. 13, the printed features remaining after the application of the stencil printing technology are used as masks for etching the metal layer 20. This exposes an uncovered die region 40. FIG. 15 shows the bump area 32 after the metal layer 20 has been etched. Thus, the redistribution line 24 serves as a self-aligning mask for etching the metal layer 20 on the contact layer of the semiconductor die 10. In this embodiment, the reflow process of the solder bump occurs only after the metal layer etch process has been performed in a process that is further described below.

Figure 16:
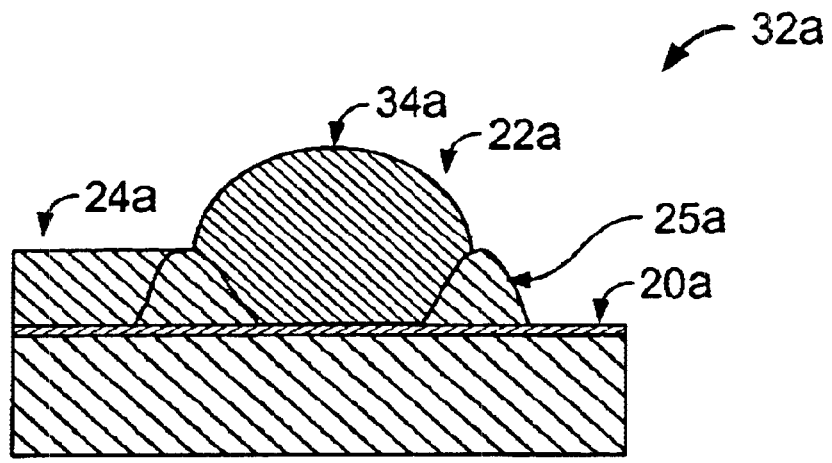
FIG. 16 shows a cross-sectional view of a conductive bump area.
Figure 17:
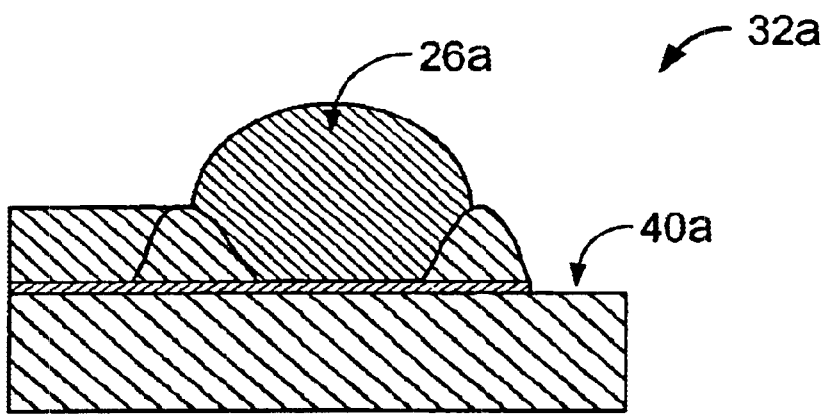
FIG. 17 shows a cross-sectional view of the conductive bump area of FIG. 16 after the metal layer etch.

Similarly, FIGS. 16 and 17 show the details of the bumping step 106 and the subsequent etching of the metal layer 20a using printed compliant conductive bumps. FIG. 16 shows the bump area 32a after the re-routing printing process 104. A conductive bump 34a is formed by depositing a conductive bump material within a ring recess 26a of the bump region 22a at the first end 25a of the redistribution line 24a. FIG. 17 shows the bump area 32a after the etching of the metal layer 20a has exposed an uncovered die region 40a. The etching of the metal layer 20a is achieved by using the redistribution line 24a as a self-aligning mask.

Figure 18:
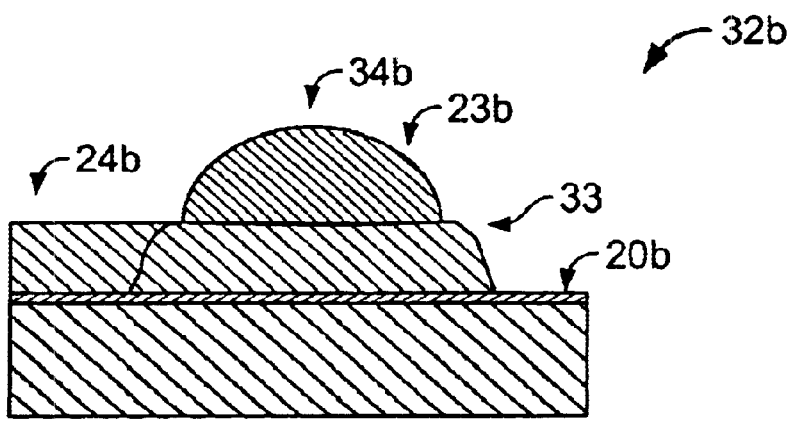
FIG. 18 shows another conductive bump region for an alternate embodiment.
Figure 19:
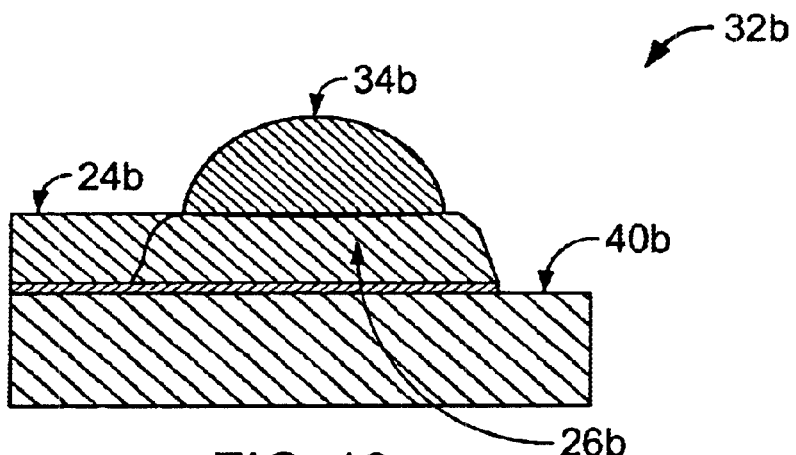
FIG. 19 shows the conductive bump region of FIG. 18 after the metal layer etch.

FIGS. 18 and 19 show a bump area 32b having an alternate redistribution structure 23b. The first end of the redistribution line 24b includes a re-routing line pad 33. In this embodiment, the re-routing line pad 33 provides the electrical interconnection between the interconnect bump 34b and the circuitry below the metal layer 20b. A ring recess in the bump region 22b is no longer needed as the conductive bump material is printed directly onto the re-routing line pad 33 to form the interconnect bump 34b.

FIG. 19 shows the result of etching the metal layer 20b by using the same method as described earlier, namely, using the printed features of the redistribution structure 23b as a self-aligning etching mask.

Figure 9:
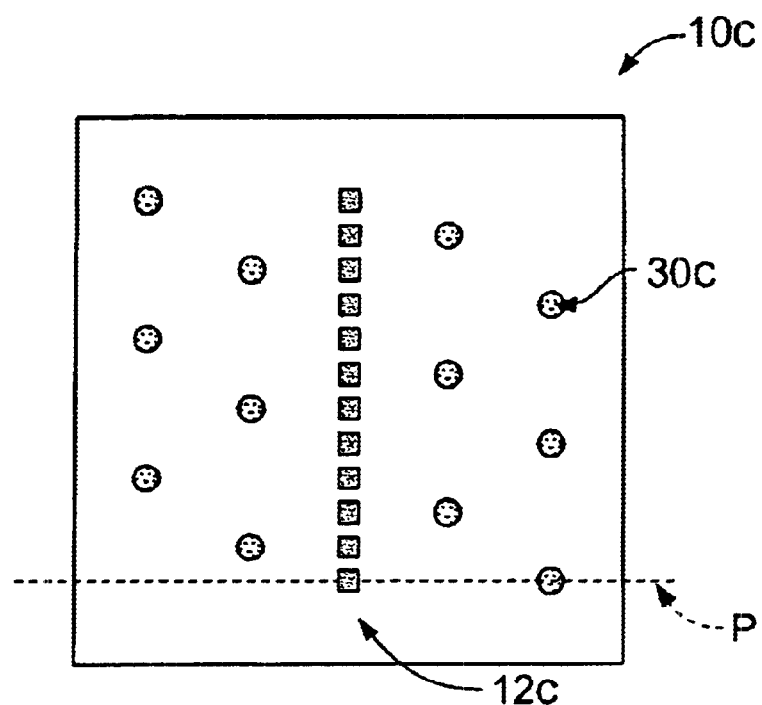
FIG. 9 is a top view of an alternate process.
Figure 10:
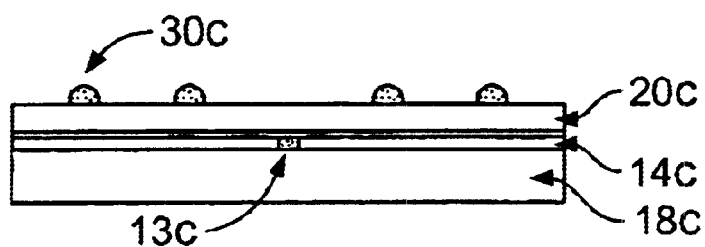
FIG. 10 is a cross-sectional view of the die of FIG. 9, along the line X—X.

FIGS. 9 through 12 illustrate an alternate embodiment of the processes of the present invention. Subsequent to the passivation process 100 and metallization process 102, a nonconductive print process 108 is performed (FIGS. 9 and 10). During this process, a print of nonconductive bump material 51 (shown in FIG. 20) is deposited above the metal layer 20c to form an interconnect bump 30c. In order to improve the cost efficiency of the printing process, nonconductive materials such as silicone or other elastomers are deposited using stencil printing technology as described earlier.

FIG. 9 shows the contact pad layout 12c in an interior region of a die 10c with a print of nonconductive polymers 30c deposited on the metal layer 20c. FIG. 10 shows in cross section, along a line P, a nonconductive polymer bump 30c deposited sequentially above the silicon layer 18c, the passivation layer 14c, and the metal layer 20c.

Figure 11:
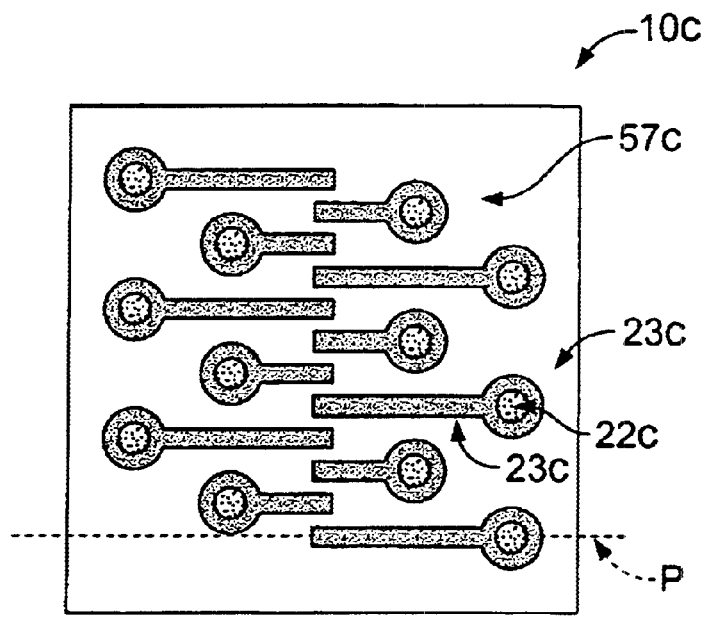
FIG. 11 is a top view of die of FIG. 10 with printed redistribution structures.
Figure 12:
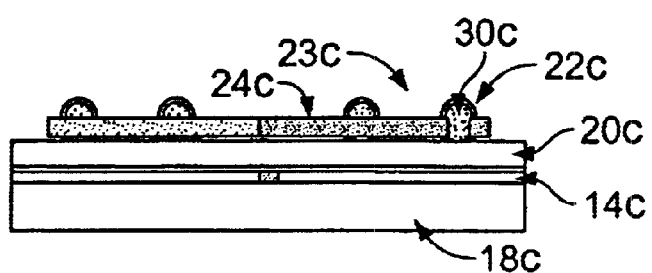
FIG. 12 is a cross-sectional view of the die of FIG. 11, along the line X—X.
Figure 20:
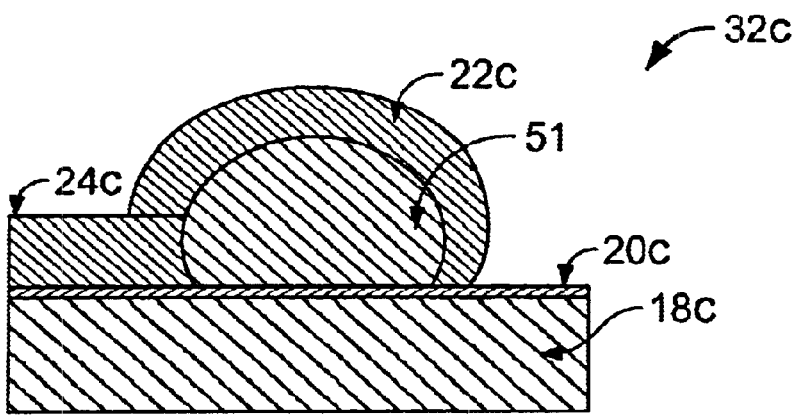
FIG. 20 shows a cross sectional view of another embodiment using a nonconductive under bump material.

FIG. 11 shows the top view of the die 10c after the printed re-routing trace 57c has been formed by the print of the redistribution structure 23c. As is apparent from FIG. 12, the conductive redistribution structure 23c entirely covers the nonconductive interconnect bump 30c in the bump region 22c. FIG. 20 shows an exploded cross sectional view of the bump area 32c of the semiconductor die 10c of FIGS. 9 and 10. Following the same process as described earlier, the patterned polymers are used as masks to etch the metal plating.

Although the invention, preferably relates to printed rerouting for chips size packaging, other fields of application are entirely within the scope of the invention, especially in the broad sector of wafer level packaging. Thus, a number of embodiments of the invention have been described. Nevertheless, it will be understood that various modifications may be made without departing from the spirit and scope of the invention. Accordingly, other embodiments are within the scope of the following claims.

What is claimed is:

1. A method for forming printed re-routing for wafer level packaging, the method comprising:
   forming a contact layer on a semiconductor die;
   printing a conductive redistribution structure on the contact layer; and,
   etching the contact layer of the die by using the conductive redistribution structure as a self-aligning mask;
   wherein an under bump material (UBM) is deposited onto the contact layer of the die prior to the forming of a conductive redistribution structure on the contact layer of the die.

2. The method of claim 1 wherein the forming of a contact layer includes realizing semiconductor defining processes on the contact layer of the semiconductor die.

3. The method of claim 2 wherein realizing semiconductor structure defining processes comprises forming a passivation layer on the contact layer of the die.

4. The method of claim 3 further comprising using the passivation layer to protect the contact layer.

5. The method of claim 3 further comprising forming the passivation layer from a dielectric material.

6. The method of claim 5, wherein the dielectric material comprises a polyimide.

7. The method of claim 1 wherein the printing the conductive redistribution structure comprises printing a bump region.

8. The method of claim 7 further comprising printing an interconnect bump on the bump region of the conductive redistribution structure for providing an external connection between the contact layer and a carrier surface.

9. The method of claim 8 wherein the semiconductor die is mounted onto the carrier surface formed from a group consisting of metals, epoxy, glass, and ceramics.

10. The method of claim 7 further comprising depositing an interconnect bump material within the bump region of the conductive redistribution structure.

11. The method of claim 10 wherein the interconnect bump material is comprises solder paste.

12. The method of claim 10 wherein the interconnect bump material comprises is a conductive polymer.

13. The method of claim 12 wherein the conductive polymer is an Isotropic Conductive Adhesive (ICA).

14. The method of claim 1 wherein printing a conductive redistribution structure comprises printing the conductive redistribution structure in one step.

15. The method of claim 1 wherein printing a conductive redistribution structure comprises stencil printing.

16. The method of claim 1 further comprising using a conductive material selected from a group consisting of conductive polymers and glues to form the conductive redistribution structure.

17. The method of claim 16 wherein the conductive material comprises Isotropic Conductive Adhesive (ICA).

18. The method of claim 1 wherein the under bump material (UBM) is nonconductive.

19. A method for forming printed re-routing for wafer level packaging, the method comprising:
   forming a contact layer on a semiconductor die;
   printing a conductive redistribution structure on the contact layer; and,
   etching the contact layer of the die by using the conductive redistribution structure as a self-aligning mask; and
   forming a passivation layer having a contact pad;
   wherein the forming of the contact layer includes realizing semiconductor defining processes on the contact layer of the semiconductor die and wherein realizing semiconductor structure defining processes comprises forming the passivation layer on the contact layer of the die.

20. The method of claim 19 wherein realizing the semiconductor structure defining processes further comprises sputtering a conductive material onto the passivation layer and forming a metal layer on the contact layer.

21. The method of claim 20 wherein a bump region is formed by printing a conductive material directly onto the contact pad of the conductive redistribution structure.

22. The method of claim 21 wherein the conductive redistribution structure serves as a self-aligning mask for etching the metal layer.

23. The method of claim 20 further comprising providing an electrical contact between the contact pad and the redistribution structure.

24. The method of claim 20 wherein the etching of the contact layer of the die comprises etching the metal layer of the contact layer.

25. The method of claim 20 wherein the conductive redistribution structure includes a first end and second end.

26. The method of claim 25 wherein the first end includes the bump region having a ring recess and a guide region serving as a bump stop for surrounding and retaining the interconnect bump to prevent the outflow of the interconnect bump material.

27. The method of claim 26 wherein the guide region serves as a solder stop.

28. The method of claim 26 wherein the conductive redistribution structure serves as a self-aligning mask for the etching of the metal layer.

29. The method of claim 19 further comprising forming the contact pad from a conductive material selected from the group consisting of metals and metal alloys.

* * * * *